(12) United States Patent
Hwang et al.

(10) Patent No.: US 9,606,207 B2
(45) Date of Patent: *Mar. 28, 2017

(54) METHOD AND APPARATUS FOR GENERATING MAGNETIC RESONANCE IMAGE

(71) Applicants: SAMSUNG ELECTRONICS CO., LTD., Suwon-si (KR); KOREA UNIVERSITY RESEARCH AND BUSINESS FOUNDATION, Seoul (KR)

(72) Inventors: Jin-young Hwang, Suwon-si (KR); Su-hyung Park, Seoul (KR); Jaeseok Park, Seoul (KR)

(73) Assignees: SAMSUNG ELECTRONICS CO., LTD., Suwon-si (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 1024 days.

This patent is subject to a terminal disclaimer.

(21) Appl. No.: 13/673,624

(22) Filed: Nov. 9, 2012

(65) Prior Publication Data

US 2013/0300413 A1    Nov. 14, 2013

(30) Foreign Application Priority Data

May 10, 2012  (KR) .................. 10-2012-0049780

(51) Int. Cl.
*G01V 3/00* (2006.01)
*G01R 33/54* (2006.01)
(Continued)

(52) U.S. Cl.
CPC .......... *G01R 33/54* (2013.01); *G01R 33/341* (2013.01); *G01R 33/5608* (2013.01); *G01R 33/5611* (2013.01)

(58) Field of Classification Search
CPC ..................................................... G01R 33/54
(Continued)

(56) References Cited

U.S. PATENT DOCUMENTS 5,736,857 A * 4/1998 Taft ............................. 324/309
5,910,728 A   6/1999 Sodickson
(Continued)

FOREIGN PATENT DOCUMENTS

| JP | 9-238920 A | 9/1997 |
| JP | 2010-82372 A | 4/2010 |
| KR | 2007-510488 A | 4/2007 |

OTHER PUBLICATIONS

Communication dated Jun. 21, 2013 issued by the Korean Intellectual Property Office in counterpart Korean Patent Application No. 10-2012-0049780.

*Primary Examiner* — Rodney Fuller
(74) *Attorney, Agent, or Firm* — Sughrue Mion, PLLC

(57) ABSTRACT

A method of generating a magnetic resonance image includes: generating composite data by using a plurality of data sets acquired from a plurality of coils, based on coil characteristics of the plurality of coils; generating first interpolation data by interpolating the composite data; generating a plurality of filtered data sets by filtering the first interpolation data with respect to a plurality of frequency bands; and generating the magnetic resonance image by using the plurality of filtered data sets.

20 Claims, 12 Drawing Sheets

(51) Int. Cl.
*G01R 33/341* (2006.01)
*G01R 33/56* (2006.01)
*G01R 33/561* (2006.01)

(58) Field of Classification Search
USPC .......................................................... 324/309
See application file for complete search history.

(56) References Cited

U.S. PATENT DOCUMENTS

| | | | |
|---|---|---|---|
| 6,208,139 B1* | 3/2001 | Foo et al. | 324/309 |
| 6,289,232 B1 | 9/2001 | Jakob et al. | |
| 6,782,143 B1* | 8/2004 | Dube et al. | 382/300 |
| 6,841,998 B1* | 1/2005 | Griswold | 324/309 |
| 7,385,397 B2* | 6/2008 | Uchizono et al. | 324/318 |
| 8,049,505 B2* | 11/2011 | Van Liere | 324/322 |
| 2002/0158632 A1* | 10/2002 | Sodickson | 324/307 |
| 2003/0006770 A1* | 1/2003 | Smith | 324/309 |
| 2003/0062901 A1* | 4/2003 | Zhang et al. | 324/322 |
| 2004/0051526 A1* | 3/2004 | Lee et al. | 324/307 |
| 2005/0134266 A1* | 6/2005 | Kabasawa | 324/309 |
| 2007/0069727 A1 | 3/2007 | Schulz et al. | |
| 2008/0144900 A1* | 6/2008 | Li et al. | 382/130 |
| 2010/0079141 A1* | 4/2010 | Stemmer | 324/309 |
| 2010/0244825 A1* | 9/2010 | Brau et al. | 324/309 |
| 2011/0286648 A1* | 11/2011 | Sharif et al. | 382/131 |
| 2013/0301891 A1* | 11/2013 | Hwang et al. | 382/131 |
| 2014/0070804 A1* | 3/2014 | Huang et al. | 324/309 |
| 2014/0376794 A1* | 12/2014 | Dumoulin et al. | 382/131 |

* cited by examiner

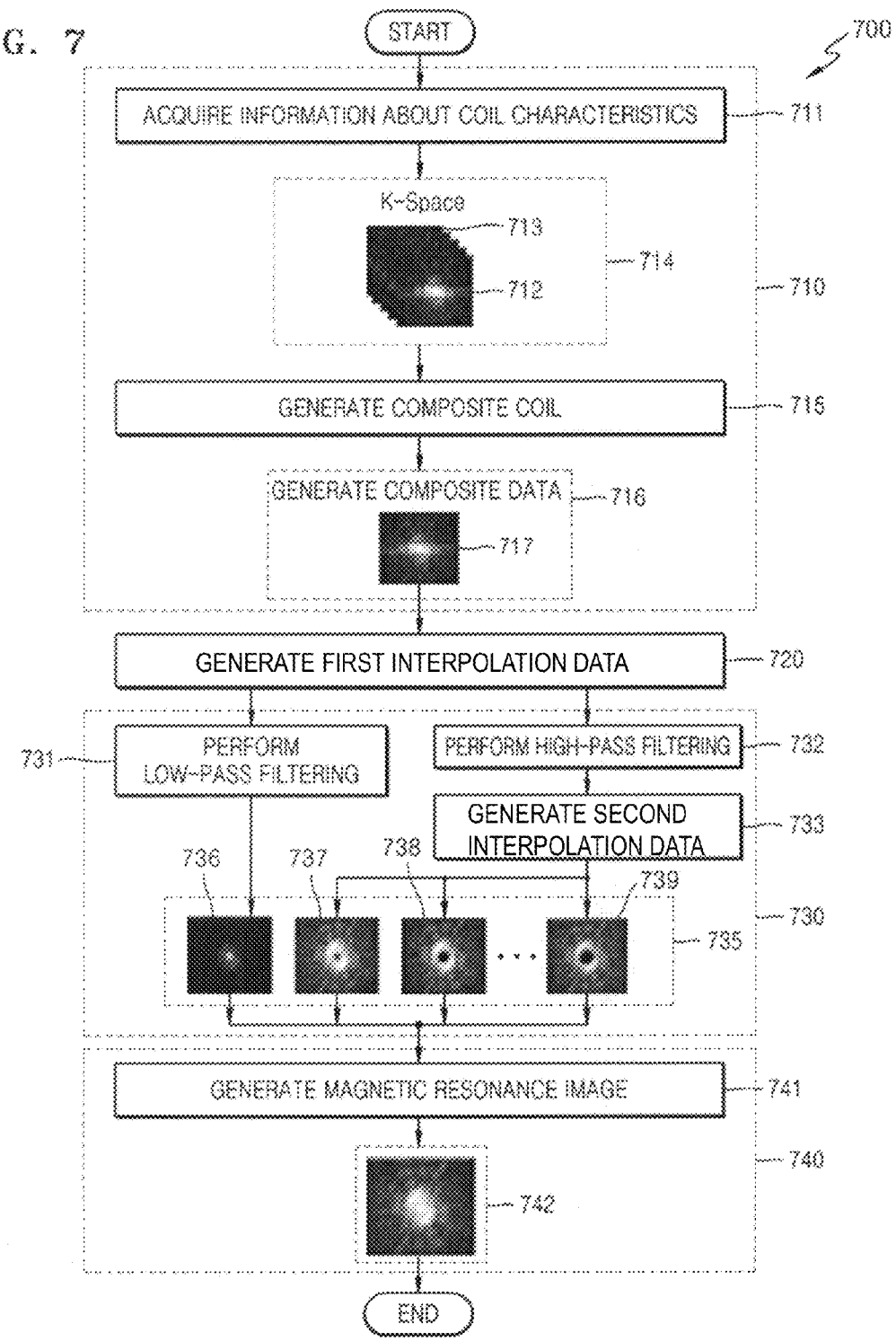

METHOD AND APPARATUS FOR GENERATING MAGNETIC RESONANCE IMAGE

CROSS-REFERENCE TO RELATED PATENT APPLICATION

This application claims priority from Korean Patent Application No. 10-2012-0049780, filed on May 10, 2012, in the Korean Intellectual Property Office, the disclosure of which is incorporated herein in its entirety by reference.

BACKGROUND

1. Field

Exemplary embodiments relate to methods and apparatuses for generating a magnetic resonance image.

2. Description of the Related Art

Magnetic resonance imaging (MRI) apparatuses are used to acquire an image of a subject by using a magnetic field, to accurately diagnose diseases since MRI apparatuses show stereoscopic image of bones, discs, joints, nerve ligaments, etc., at a desired angle.

An MRI apparatus acquires a magnetic resonance (MR) signal and reconstructs the acquired MR signal to output an image. The MRI apparatus acquires an MR signal by using radio frequency (RF) coils, a permanent magnet, a gradient coil, and the like. When an MR signal is acquired, an invalid signal may be generated in a joining parts of RF coils. For example, since the MR signal is not measured in a joining part of adjacent RF coils, the non-measured invalid signal may appear as noise in the reconstructed magnetic resonance image. In addition, while K-space data acquired in RF coils are reconstructed as a magnetic resonance image, noise existing in the K-space data may be amplified.

Accordingly, an acquired MR signal has to be corrected by performing image processing such as calibration or the like, to output a magnetic resonance image without the artifacts and noise.

MRI methods of processing an acquired MR signal include sensitivity encoding (SENSE) method, a generalized auto-calibrating partially parallel acquisition (GRAPPA) method, and the like.

An image-based imaging method, such as the SENSE method, calculates coil sensitivity information by separating an image corresponding to each individual coil via self-calibration in an image space. An image of each individual coil is acquired by performing inverse Fourier transformation on central portion data of a K-space, which has been Nyquist-sampled. However, when reconstructing a magnetic resonance image by using the coil sensitivity information, image-based self-calibration needs very accurate coil sensitivity information.

Accordingly, a large number of calibration signals is required in a central portion of K-space data, and therefore, a time taken to form an image increases. In addition, when a field of view (FOV) is smaller than a subject to be imaged, the image-based self-calibration may cause residual aliasing artifacts during image reconstruction.

A K-space-based imaging method, such as the GRAPPA method, calculates spatial correlations or convolution kernels between a calibration signal and an adjacent measured source signal by performing self-calibration. The GRAPPA method does not need accurate coil sensitivity information and is not limited in reconstruction of the FOV. However, when data of an image signal is damaged due to the noise and spatial correlations are changed, residual aliasing artifacts and amplified noise occur in a reconstructed image.

Accordingly, there is a need for methods and apparatuses which are capable of reducing aliasing artifacts and noise in the magnetic resonance image when data of an image signal is damaged.

SUMMARY

Exemplary embodiments may address at least the above problems and/or disadvantages and other disadvantages not described above. Also, exemplary embodiments are not required to overcome the disadvantages described above, and an exemplary embodiment may not overcome any of the problems described above.

One or more exemplary embodiments provide a method of generating a magnetic resonance image, which is capable of reducing aliasing artifacts and noise.

One or more exemplary embodiments provide an apparatus for generating a magnetic resonance image, which is capable of reducing aliasing artifacts and noise.

One or more exemplary embodiments provide a method of generating a magnetic resonance image, which is capable of reducing residual aliasing artifacts and noise while maintaining the accuracy of the magnetic resonance image.

One or more exemplary embodiments provide an apparatus for generating a magnetic resonance image, which is capable of reducing residual aliasing artifacts and noise while maintaining the accuracy of the magnetic resonance image.

According to an aspect an exemplary embodiment, there is provided a method of generating a magnetic resonance image by using a multi-coil including a plurality of coils, the method including: generating composite data by using a plurality of data acquired in each of the plurality of coils, based on coil characteristics of the plurality of coils; generating first interpolation data by interpolating the composite data; generating a plurality of filtered data by filtering the first interpolation data with respect to each of a plurality of frequency bands; and acquiring the magnetic resonance image by using the plurality of filtered data.

The generating of the composite data may include: generating a composite coil corresponding to the plurality of coils, based on the coil characteristics; and generating the composite data corresponding to the composite coil by using the plurality of data.

The generating of the composite coil may include: acquiring at least one of coil sensitivity of the plurality of coils and noise information of the plurality of coils; and generating the composite coil corresponding to the plurality of coils, based on at least one of the coil sensitivity and the noise information.

The generating of the plurality of filtered data may include generating the filtered data by discriminately filtering the first interpolation data in at least one of the plurality of frequency bands.

The plurality of frequency bands may include a low frequency band and a high frequency band, and the generating of the plurality of filtered data may include: generating the filtered data corresponding to the low frequency band by low-pass filtering the first interpolation data; and generating the filtered data corresponding to the high frequency band by high-pass filtering the first interpolation data by discriminately applying a plurality of filtering characteristics.

The acquiring of the magnetic resonance image may include generating at least one second interpolation data by interpolating at least one filtered data corresponding to at least one of the plurality of frequency bands.

The acquiring of the magnetic resonance image may further include acquiring the magnetic resonance image by performing a weighted combination on at least one of the plurality of filtered data and the at least one second interpolation data.

The generating of the composite data may include generating the composite coil by adjusting signal-to-noise ratios of the plurality of coils based on the coil characteristics.

The coil characteristics may include at least one of a coil sensitivity of each of the plurality of coils and noise information including at least one of noise map and noise dispersion information.

The generating of the first interpolation data may include generating the first interpolation data by interpolating the composite data through a convolution interpolation method.

According to an aspect of an exemplary embodiment, there is provided an apparatus for generating a magnetic resonance image by using a multi-coil including a plurality of coils, the apparatus including: a combiner that generates composite data by using a plurality of data acquired in each of the plurality of coils, based on coil characteristics of the plurality of coils; a filter that generates first interpolation data by interpolating the composite data and generates a plurality of filtered data by filtering the first interpolation data with respect to each of a plurality of frequency bands; and an image generator that acquires the magnetic resonance image by using the plurality of filtered data.

The combiner may include: a coil combiner that generates a composite coil corresponding to the plurality of coils, based on the coil characteristics; and a composite data generation unit that generates the composite data corresponding to the composite coil by using the plurality of data.

The combiner may further include a coil characteristic acquiring unit that acquires at least one of coil sensitivity of the plurality of coils and noise information of the plurality of coils.

The coil combiner may generate the composite coil by adjusting signal-to-noise ratios of the plurality of coils based on the coil characteristics.

The filter may include: a first interpolator that generates the first interpolation data by interpolating the composite data; a filter unit that generates the plurality of filtered data by filtering the first interpolation data with respect to each of the plurality of frequency bands.

The filter unit may generate the filtered data by discriminately filtering the first interpolation data in at least one of the plurality of frequency bands.

The image generator may include a second interpolator that generates at least one second interpolation data by interpolating at least one filtered data corresponding to at least one of the plurality of frequency bands.

The filter may include: a low-pass filter that generates the filtered data corresponding to a low frequency band by low-pass filtering the first interpolation data; and a high-pass filter unit that includes a plurality of high-pass filters for generating the filtered data corresponding to a high frequency band by high-pass filtering the first interpolation data by discriminately applying a plurality of filtering characteristics.

The image generator may include: a second interpolator that generates a plurality of second interpolation data by interpolating the plurality of filtered data that are output from the high-pass filter unit; and a magnetic resonance image generator that acquires the magnetic resonance image by performing a weighted combination on the a plurality of filtered data, which are output from the low-pass filter, and the a plurality of second interpolation data.

According to an aspect of an exemplary embodiment, there is provided a method of generating a magnetic resonance image by using a multi-coil including a plurality of coils, the method including: generating composite data by combining a plurality of data acquired in each of the plurality of coils, based on coil characteristics of the plurality of coils; generating first interpolation data by interpolating the composite data; and generating at least one second interpolation data by interpolating at least one predetermined data corresponding to the first interpolation data.

BRIEF DESCRIPTION OF THE DRAWINGS

The above and/or other aspects will become more apparent by describing certain exemplary embodiments, with reference to the accompanying drawings, in which:

FIG. 7 is a diagram illustrating a method of generating a magnetic resonance image, according to an exemplary embodiment;

DETAILED DESCRIPTION

Figure 1:
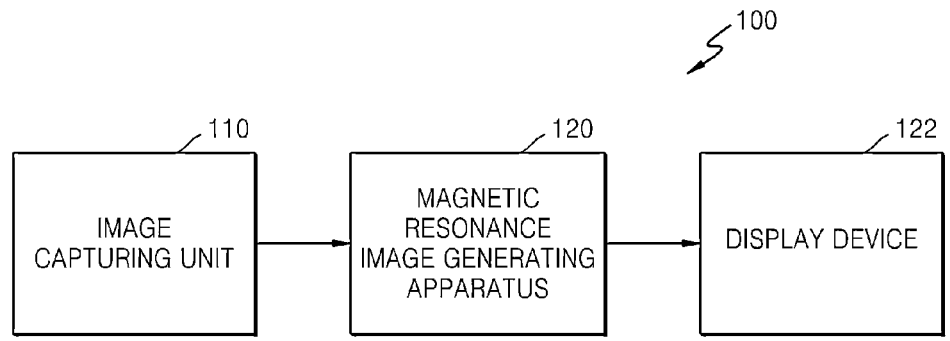
FIG. 1 is a block diagram of an MRI system according to an exemplary embodiment.

Certain exemplary embodiments are described in greater detail below with reference to the accompanying drawings.

In the following description, the same drawing reference numerals are used for the same elements even in different drawings. The matters defined in the description, such as detailed construction and elements, are provided to assist in a comprehensive understanding of exemplary embodiments. Thus, it is apparent that exemplary embodiments can be carried out without those specifically defined matters. Also, well-known functions or constructions are not described in detail since they would obscure exemplary embodiments with unnecessary detail.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of an MRI system 100 including a magnetic resonance image generating apparatus according to an exemplary embodiment.

Referring to FIG. 1, the MRI system 100 includes an image capturing unit 110 and a magnetic resonance image generating apparatus 120 according to an exemplary embodiment.

The image capturing unit 110 includes a gradient coil (not shown) and a multi-coil (not shown) including a plurality of RF coils, and generates data by capturing an image of a subject by using the multi-coil, based on a K-space that is adjusted by driving the gradient coil. The image capturing unit 110 is described in detail with reference to FIG. 2 below. The data generated in the image capturing unit 110 may be K-space data. The K-space data is a set of raw data from which an image may be generated.

The magnetic resonance image generating apparatus 120 receives a plurality of data that are transmitted from the image capturing unit 110. The plurality of data may be images including image information of the K-space, which has been acquired in each of the plurality of RF coils included in the multi-coil of the image capturing unit 110.

The magnetic resonance image generating apparatus 120 generates a magnetic resonance image by processing the received data according to a predetermined imaging method. The predetermined imaging method may include restoring a non-measured signal and removing residual aliasing artifacts and noise. The generated magnetic resonance image is displayed on a display device 122 or output to an external device such as a personal computer or a medical professional workstation. An image processing operation of the magnetic resonance image generating apparatus 120 is described in detail with reference to FIG. 3 below.

Figure 2:
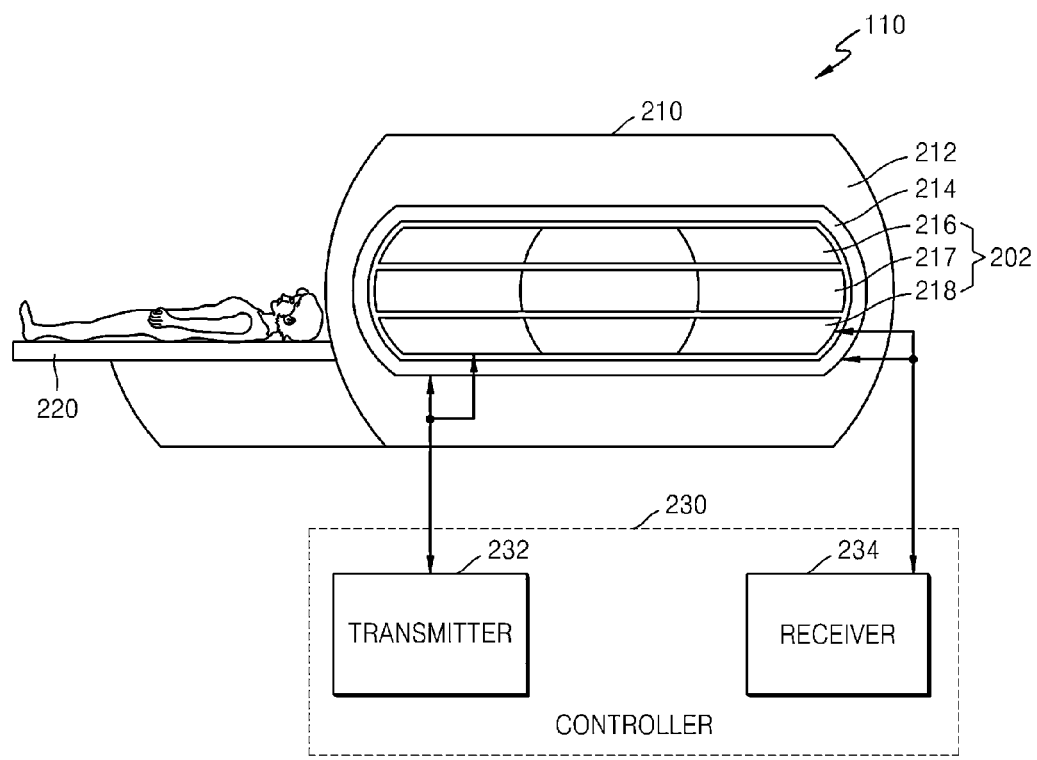
FIG. 2 is a detailed diagram of an image capturing unit illustrated in FIG. 1.

FIG. 2 is a diagram illustrating in detail the image capturing unit 110 of FIG. 1.

Referring to FIG. 2, the image capturing unit 110 includes an MRI scanner 210 and a controller 230.

The MRI scanner 210 includes a main magnet, a secondary magnetic field apparatus, and a patient bed 220.

The main magnet 212, which is a magnet for forming a main magnetic field, may include a permanent magnet, a superconducting electromagnet, or the like, and may be a cylindrical magnet disposed around the bore.

The secondary magnetic field apparatus, which is an apparatus for forming a secondary magnetic field, may include a gradient coil 214 and an RF multi-coil 202.

The gradient coil 214 forms a gradient magnetic field in the x, y, and z directions, and is used for setting a field of view FOV that is a section to be imaged in a subject.

The RF multi-coil 202 includes a plurality of coils 216, 217, and 218, and is driven to transmit a radio wave to induce resonance phenomena. A K-space image is generated by receiving an RF signal that is generated by driving the plurality of coils 216, 217, and 218.

The controller 230 drives magnets included in the MRI scanner 210. The controller 230 outputs an RF signal to the MRI scanner 210 and receives an RF signal that is generated corresponding to the output RF signal. Then, the controller 230 generates a plurality of data corresponding to the plurality of coils 216, 217, and 218, based on the received RF signal.

In detail, the controller 230 may include a transmitter 232 and a receiver 234. The transmitter 232 generates the RF signal and outputs the RF signal to the MRI scanner 210. The MRI scanner 210 generates a magnetic resonance signal according to the RF signal transmitted by the transmitter 232.

The receiver 234 receives the magnetic resonance signal generated in the MRI scanner 210 as an RF signal and generates raw data based on the received RF signal. The raw data is data of the K-space, and the receiver 234 may generate n data sets (where n is a natural number) corresponding to n coils when the RF multi-coil 202 includes the n coils.

The n data sets generated in the receiver 234 are transmitted to the magnetic resonance image generating apparatus 120 of FIG. 1, and a final magnetic resonance image is generated.

Figure 3:
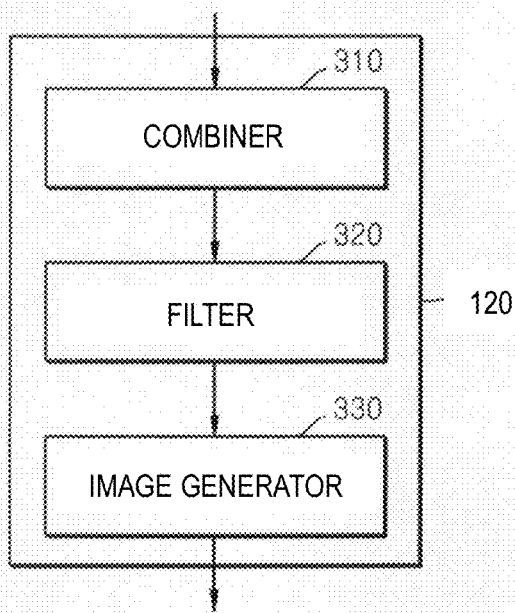
FIG. 3 is a block diagram of a magnetic resonance image generating apparatus according to an exemplary embodiment.

FIG. 3 is a block diagram of a magnetic resonance image generating apparatus 120 according to an exemplary embodiment.

Referring to FIG. 3, the magnetic resonance image generating apparatus 120 includes a combiner 310, a filter 320, and an image generator 330. The magnetic resonance image generating apparatus 120 receives a plurality of data acquired by an RF multi-coil 202 including a plurality of coils, and generates a magnetic resonance image by using the received data. The plurality of data that are received by the magnetic resonance image generating apparatus 120 may be the raw data generated in the K-space.

The combiner 310 generates composite data by using the plurality of data acquired in each of the plurality of coils, based on coil characteristics of the plurality of coils. The plurality of coils may include the coils 216, 217, and 218 included in the RF multi-coil 202 illustrated in FIG. 2.

In detail, the coil characteristics are values that have an influence on the quality of the K-space data that is generated by a coil. For example, the coil characteristics may include coil sensitivity, a degree of noise dispersion of a coil, and/or a noise map of a coil. The plurality of data acquired in each of the plurality of coils are K-space data captured in each of the plurality of coils. In an example described below, the RF multi-coil includes n coils and the plurality of data are n data sets which correspond to the n coils.

For example, the combiner 310 may compose the plurality of data acquired in each of the plurality of coils, and may generate composite data by correcting the combined data based on the coil characteristics of the plurality of coils. That is, the composite data corresponding to the entire image may be generated by composing n data sets corresponding to partial images and correcting the composed data.

As another example, the combiner 310 may generate one virtual composite coil, which corresponds to the plurality of coils and of which a signal-to-noise ratio (SNR) has been increased, based on the coil characteristics of the plurality of coils, and generate composite data captured by the virtual composite coil.

The filter 320 generates first interpolation data by interpolating the composite data, and generates a plurality of filtered data by filtering the first interpolation data with respect to each of a plurality of frequency bands. In this case, the filter 320 may generate the first interpolation data by interpolating the composite data via a convolution interpolation method.

The image generator 330 acquires a magnetic resonance image by using the filtered data generated in the filter 320.

Figure 4:
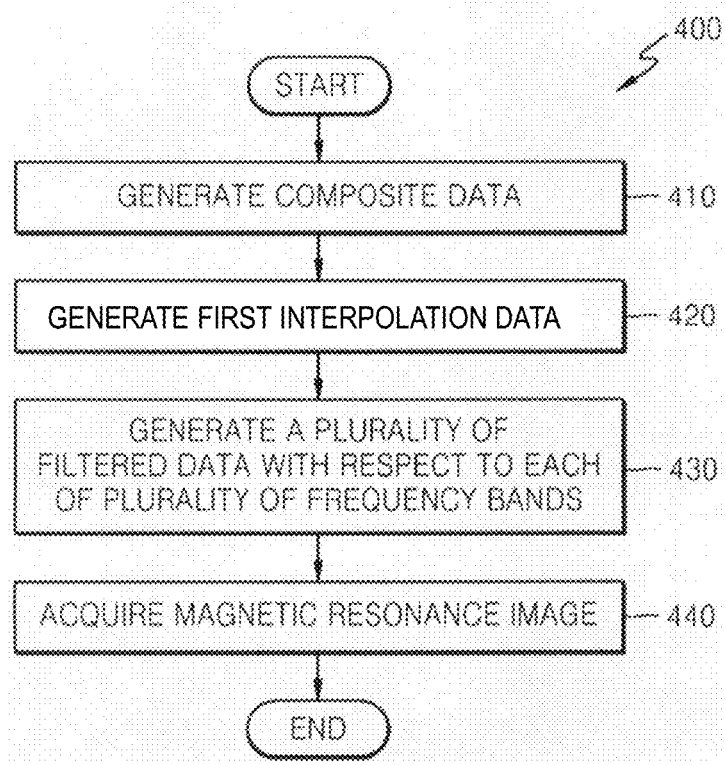
FIG. 4 is a flowchart illustrating a method of generating a magnetic resonance image, according to an exemplary embodiment.

FIG. 4 is a flowchart illustrating a method 400 of generating a magnetic resonance image, according to an exemplary embodiment.

The method 400 of generating a magnetic resonance image is described with reference to the magnetic resonance image generating apparatus 120 illustrated in FIGS. 1 and 3.

Referring to FIG. 4, the method 400 is a method of generating a magnetic resonance image by using a multi-coil including a plurality of coils.

In operation 410, the composite data is generated by using a plurality of data acquired in each of the plurality of coils, based on coil characteristics of the plurality of coils. Operation 410 may be performed by the combiner 310.

In operation 420, the first interpolation data is generated by interpolating the composite data generated in operation 410. Operation 420 may be performed by the filter 320.

In operation 430, a plurality of filtered data are generated by filtering the first interpolation data with respect to each of a plurality of frequency bands. Operation 430 may be performed by the filter 320.

In operation 440, a magnetic resonance image is acquired by using the plurality of filtered data generated in operation 430. Operation 440 may be performed by the image generator 330.

Figure 5:
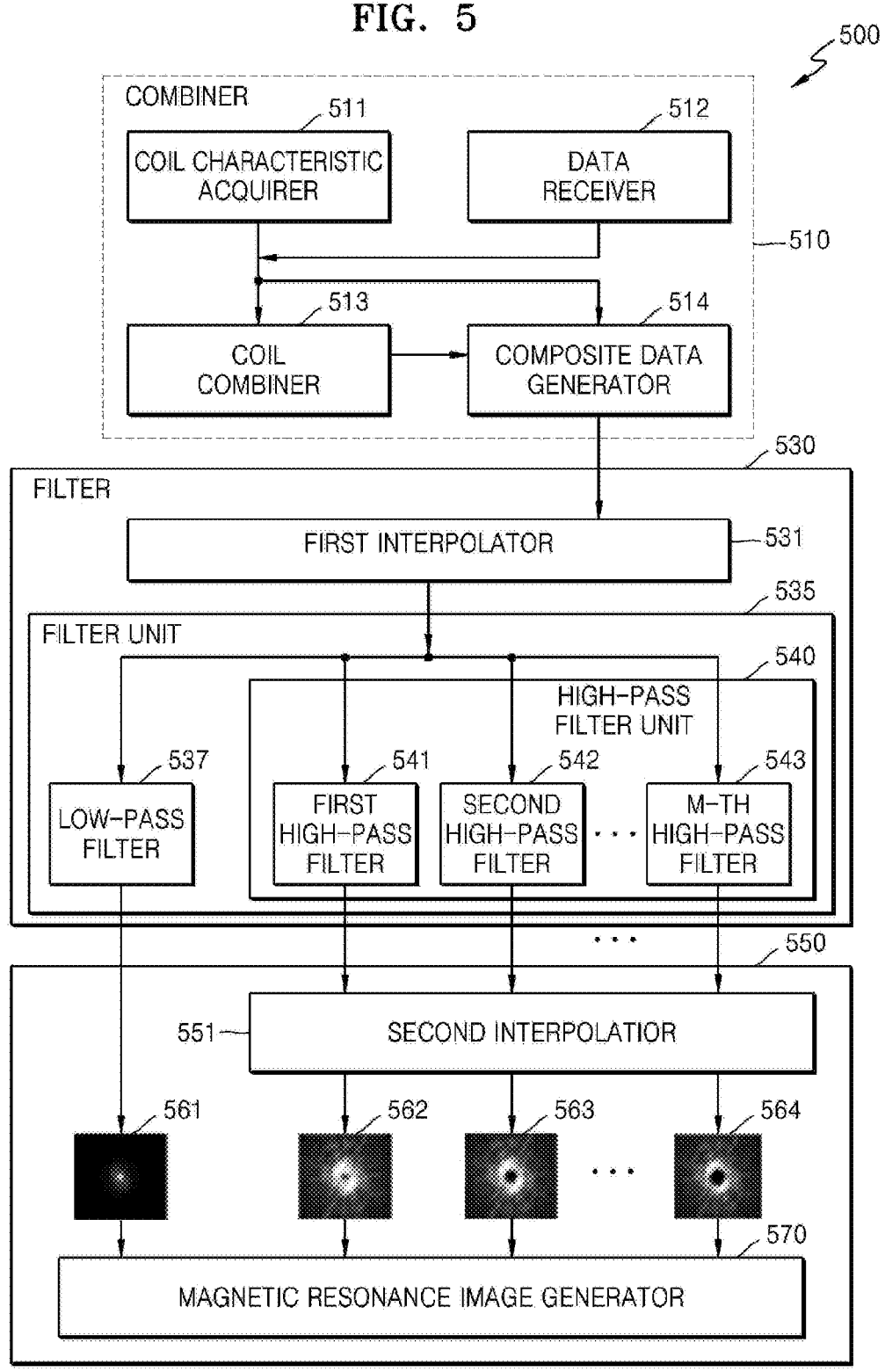
FIG. 5 is a block diagram of a magnetic resonance image generating apparatus according to an exemplary embodiment.

FIG. 5 is a block diagram of a magnetic resonance image generating apparatus according to an exemplary embodiment. The magnetic resonance image generating apparatus 500 corresponds to the magnetic resonance image generating apparatus 120 illustrated in FIG. 3. In detail, a combiner 510, a filter 530, and an image generator 550 of FIG. 5 correspond to the combiner 310, the filter 320, and the image generator 330 of FIG. 3, respectively. Thus, the above description of FIG. 3 is not repeated.

Referring to FIG. 5, the combiner 510 may include a coil combiner 513 and a composite data generator 514. In addition, the combiner 510 may further include at least one of a coil characteristic acquirer 511 and a data receiver 512.

The filter 530 may include a first interpolator 531 and a filter unit 535. The filter unit 535 may include at least one of a low-pass filter 537 and a high-pass filter unit 540. In FIG. 5, the filter unit 535 includes one low-pass filter 537 as an example. The filter unit 535 may include two, three, four, etc., low-pass filters.

The image generator 550 may include a second interpolator 551 and a magnetic resonance image generator 570.

The coil characteristic acquirer 511 may receive information about coil characteristics from the image capturing unit 110, or may itself measure coil characteristics of the RF multi-coil 202, i.e., of the plurality of coils 216, 217, and 218.

For example, the coil characteristic acquirer 511 may receive or measure information about coil characteristics including at least one of coil sensitivity of each of the plurality of coils 216, 217, and 218 and noise information of each of the coils 216, 217, and 218. The noise information of each of the coils 216, 217, and 218 may include at least one of a noise map of each of the coils and noise distribution information of each of the coils.

The data receiver 512 may receive n data sets (where n is a natural number) correspondingly captured in each of the n coils, i.e., in each of the plurality of coils 216, 217, and 218 included in the RF multi-coil 202.

Alternatively, the data receiver 512 may receive RF signals corresponding to the plurality of coils 216, 217, and 218. The data receiver 512 acquires data by variable density sampling a received RF signal in a K-space. For example, in a K-space corresponding to a predetermined coil, data corresponding to a central portion of the K-space may be generated by Nyquist sampling in a central portion of the K-space and data corresponding to a peripheral portion of the K-space may be generated by undersampling in a peripheral portion of the K-space. Accordingly, one data set is generated to correspond to one coil.

The data may be formed of image signals that are distributed in the K-space. The K-space is a space in which one axis includes frequency encoding information and another axis perpendicular to the one axis includes phase encoding information.

That is, as described above, the data receiver 512 may receive n data sets of the K-space, which correspond to the n coils, from the image capturing unit 110, or may receive RF signals corresponding to the n coils and then generate n data sets of the K-space based on the received RF signals.

The coil combiner 513 generates a composite coil corresponding to the n coils, based on information on coil characteristics that are output from the coil characteristic acquirer 511. The composite coil may be a virtual coil and represents a single coil acquired by combining the n coils.

In detail, the coil combiner 513 generates the composite coil by adjusting signal-to-noise ratios (SNRs) of the n coils, based on the information about coil characteristics. For example, the combiner 513 receives a noise map of each of the n coils as the information about coil characteristics, and adjusts coil sensitivity and a noise-related characteristic value so that a portion, in which noise exists in the data set captured in each of the n coils, is removed based on the noise map. Then, a single composite coil may be generated by combining the adjusted n coils.

In detail, the coil combiner 513 generates the composite coil to minimize noise that is generated when capturing the data in RF the multi coil 202, i.e., in the plurality of coils 216, 217, and 218.

The composite data generator 514 generates composite data corresponding to the composite coil by using the n data sets captured in the n coils. In detail, the composite data generator 514 may improve noise characteristics of the n data sets and may generate K-space composite data by combining the n data sets of which noise characteristics have been improved.

When generating a single coil by simply combining the n data sets, phase cancellation may occur, and thus, a hole may appear in an image. However, when generating the composite coil by adjusting noise characteristics of the n coils, based on at least one of the coil sensitivity and the noise information of the n coils, the phase cancellation and the hole, which may occur when combining the n data sets, may be prevented.

The first interpolator 531 generates first interpolation data by interpolating the composite data generated in the composite data generator 514. The interpolation may be performed by self-calibration of the composite data. In detail, the interpolation may be performed by using a convolution interpolation method. Accordingly, the first interpolation data in which image information lost during image capturing and non-measured image information have been restored is generated.

The filter unit 535 generates a plurality of filtered data by filtering the first interpolation data with respect to each of a plurality of frequency bands.

In detail, the plurality of frequency bands may include a low frequency band and a high frequency band, i.e., an RF band.

The filter unit 535 generates the filtered data by discriminately filtering the first interpolation data in at least one of the plurality of frequency bands.

The high-pass filter unit 540 included in the filter unit 535 may discriminately filter the first interpolation data by using first and second through mth high-pass filters 541, 542, and 543 (where m is a natural number) in the high frequency band. Thus, the high-pass filter unit 540 may output m filtered data sets corresponding to the high frequency band.

In detail, the first and second through mth high-pass filters 541, 542, and 543 have different filtering characteristics or output characteristics. Thus, the first and second through mth high-pass filters 541, 542, and 543 may generate m differently filtered data sets by filtering the first interpolation data.

The low-pass filter 537 performs a low-pass filtering of the first interpolation data and outputs the filtered data corresponding to the low frequency band.

Filtering operations of the low-pass filter 537 and the first and second through mth high-pass filters 541, 542, and 543 are described in detail with reference to FIG. 6 below.

Figure 6:
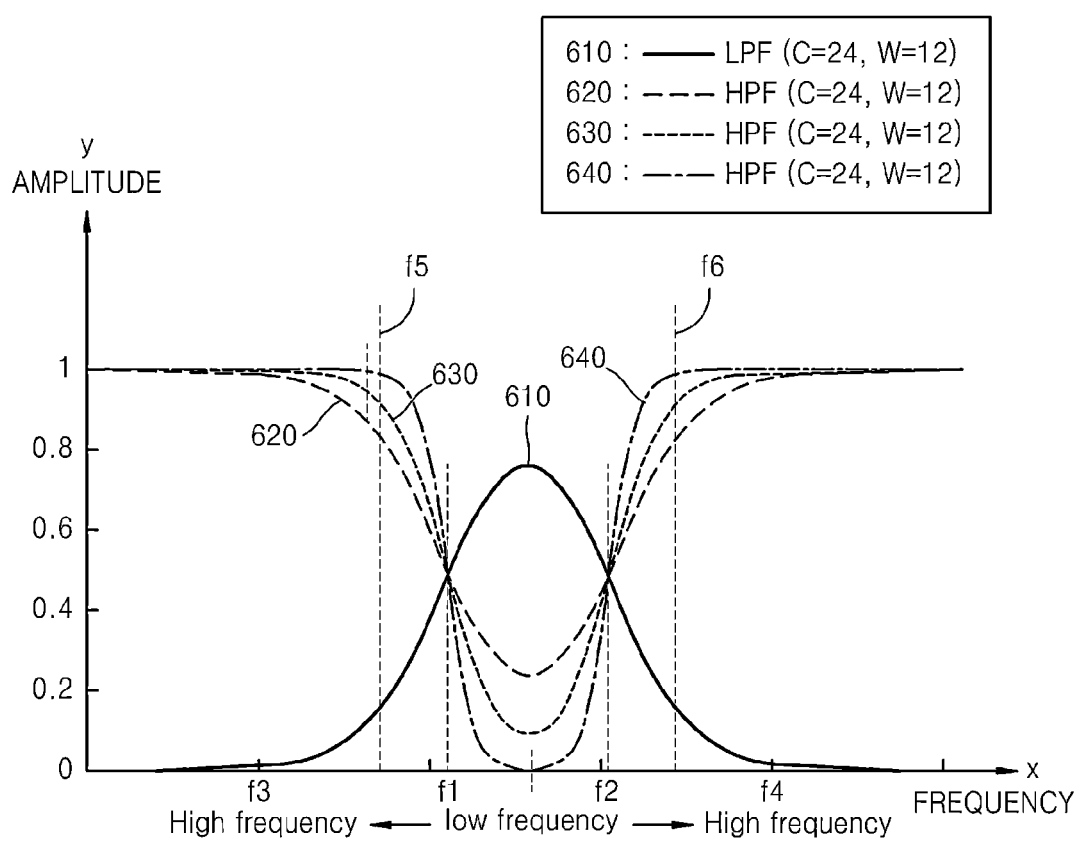
FIG. 6 is a graph illustrating a filtering operation.

FIG. 6 is a graph for describing a filtering operation of the filter unit 535 of FIG. 5.

In the graph illustrated in FIG. 6, the x axis indicates frequency, and the y axis indicates an amplitude value of a filtered signal. The amplitude value of the filtered signal is 1 when an amplitude of the filtered original signal is maintained at 100 percent, and the amplitude value of the filtered signal is 0 when the amplitude of the filtered original signal is maintained at 0 percent.

As illustrated in FIG. 5, the filter unit 535 includes three high-pass filters 541, 542, and 543, as an example. Thus, the description below pertains to three high-pass filters, as an example.

Referring to FIG. 6, a curve 610 is a filter characteristic curve of the low-pass filter 537, and a curve 620 is a filter characteristic curve of the first high-pass filter 541. A curve 630 is a filter characteristic curve of the second high-pass filter 542, and a curve 640 is a filter characteristic curve of the third high-pass filter 543.

For example, a signal value that is output from the low-pass filter 537 may be calculated by Equation 1 below, and a signal value that is output from each of the high-pass filters 541, 542, 543 may be calculated by Equation 2 below.

[Equation 1]
$$LPF = \left[1 + \exp\{(\sqrt{k_x^2 + k_y^2} - c)/w\}\right]^{-1} - \left[1 + \exp\{(\sqrt{k_x^2 + k_y^2} + c)/w\}\right]^{-1} \quad (1)$$

[Equation 2]
$$HPF = 1 - \left[1 + \exp\{(\sqrt{k_x^2 + k_y^2} - c)/w\}\right]^{-1} + \left[1 + \exp\{(\sqrt{k_x^2 + k_y^2} + c)/w\}\right]^{-1} \quad (2)$$

where $K_x$ is a signal value of the x axis coordinate of K-space data, $K_y$ is a signal value of the y axis coordinate of the K-space data, c is a coefficient value for adjusting a cutoff frequency of a filter, w is a coefficient value for adjusting smoothness of a transition period of a filter characteristic curve, LPF is a signal value that is output by being filtered in the low-pass filter, and HPF is a signal value that is output by being filtered in the high-pass filter.

Referring to FIG. 6 and Equation 1, the low-pass filter 537 passes a signal component of a low frequency band and outputs the passed signal, and blocks a signal component of an RF band.

Referring to FIG. 6 and Equation 2, the high-pass filter 541, 542, or 543 blocks a signal component of a low frequency band, and passes a signal component of a high frequency band and outputs the passed signal. In the high-pass filter 541, 542, or 543, a degree of blocking a signal component of a low frequency band may be changed according to coefficients c and w that are applied to the high-pass filter 541, 542, or 543.

Thus, the first interpolation data may be discriminately filtered by adjusting the coefficient values c and w for adjusting filter characteristics of each of the high-pass filters 541, 542, and 543.

Coefficients c and w that are applied to the respective high-pass filters 541, 542, and 543 may be experimentally optimized according to accuracy and degree of interpolation of signals that are output from the second interpolator 551, or according to the image quality of a magnetic resonance image that is generated in the magnetic resonance image generator 570.

In addition, a range of a low frequency band, in which the low-pass filter 537 filters a signal component, may be changed according to a frequency range from f3 to f4 or to a frequency range from f1 to f2, which are filtering bands indicated in the filter characteristic curve 610 of the low-pass filter 537 in FIG. 6. In addition, a range of a high frequency band, in which the high-pass filter 541, 542, or 543 filters a signal component, may be determined as a frequency band equal to or greater than f5 or a frequency band equal to or greater than f6, which are filtering bands indicated in the filter characteristic curves 620, 630, and 640 of FIG. 6.

The second interpolator 551 generates at least one second interpolation data set by interpolating at least one filtered data set corresponding to at least one of a plurality of frequency bands. In detail, the second interpolator 551 generates m second interpolation data sets 562, 563, and 564 by interpolating m filtered data sets corresponding to a high frequency band, which are output from the high-pass filter unit 540. The interpolation may be performed by using a convolution interpolation method as in the first interpolator 531.

The magnetic resonance image generator 570 may generate a magnetic resonance image by using filtered data 561 corresponding to a low frequency band, which is output from the low-pass filter 537, and a plurality of second interpolation data sets, i.e., the m second interpolation data sets 562, 563, and 564. In detail, the magnetic resonance image generator 570 may generate a magnetic resonance image by performing a weighted combination on the filtered data 561 corresponding to a low frequency band, which is output from the low-pass filter 537, and the plurality of second interpolation data sets 562, 563, and 564.

FIG. 7 is a diagram illustrating a method 700 of generating a magnetic resonance image, according to an exemplary embodiment.

Operations 716, 720, 730, and 740 of FIG. 7 may be performed similarly to operations 410, 420, 430, and 440 of FIG. 4, respectively. However, the described above with reference to FIG. 4 is not repeated. The method 700 of generating a magnetic resonance image is described with reference to the magnetic resonance image generating apparatus 500 illustrated in FIG. 5. However, the described above with reference to FIG. 5 is not repeated.

In operation 711, the information about coil characteristics is acquired. In detail, at least one of coil sensitivity and noise information of n coils included in a multi-coil may be acquired. The information about coil characteristics may be received from the outside, or may be measured by the coil characteristic acquirer 511. Operation 711 may be performed by the coil characteristic acquirer 511.

In operation 714, n data sets of a K-space, which correspond to the n coils included in the multi-coil may be received or generated. Each of the n data sets may include frequency encoding information in regard to the x axis and phase encoding information in regard to the y axis. In an example of FIG. 7, the data set 712 illustrated at the beginning of the data of the K-space is the data that has been acquired in a first coil, and the data set 713 illustrated at the end of the data of the K-space is the data that has been acquired in an n-th coil. Operation 714 may be performed by the data receiver 512.

In operation 715, a composite coil corresponding to the n coils is generated, based on the information about coil characteristics acquired in operation 711. In detail, a composite coil corresponding to the n coils may be generated based on at least one of the coil sensitivity and the noise information including a noise map, acquired in operation 711. Operation 715 may be performed by the coil combiner 513.

In operation 716, the composite data 717 corresponding to the composite coil may be generated by using the n data sets acquired in the n coils. Operation 716 may be performed by the composite data generator 514.

In operation 720, the first interpolation data is generated by interpolating the composite data generated in operation 716. Operation 720 may be performed by the first interpolator 531.

A plurality of filtered data sets are generated by filtering the first interpolation data with respect to each of a plurality of frequency bands. The plurality of frequency bands may include a low frequency band and a high frequency band, i.e., an RF band.

In operation 731, a filtered data set 736 corresponding to a low frequency band is generated by low-pass filtering the first interpolation data. In operation 732, the filtered data sets corresponding to RF bands are generated by high-pass filtering the first interpolation data by discriminately applying a plurality of filtering characteristics.

Operation 731 and operation 732 may be performed by the low-pass filter 537 and the high-pass filter unit 540, respectively.

In operation 733, at least one second interpolation data set is generated by interpolating at least one filtered data set corresponding to at least one of a plurality of frequency bands. Data sets 736, 737, 738, and 739 illustrated in FIG. 7 correspond to the data sets 561, 562, 563, and 564 illustrated in FIG. 5, respectively.

In detail, each of the second interpolation data sets 737, 738, and 739 may be generated by interpolating the filtered data set that corresponds to an RF band and is output in operation 732. Operation 733 may be performed by the second interpolator 551.

In operation 741, a magnetic resonance image 742 is generated by using at least one filtered first interpolation data set 736 and at least one of the second interpolation data sets 737, 738, and 739. In detail, the magnetic resonance image 742 is generated by performing a weighted combination on data sets 735 that are output from the filter unit 535. Operation 741 may be performed by the magnetic resonance image generator 570.

Figure 8A:
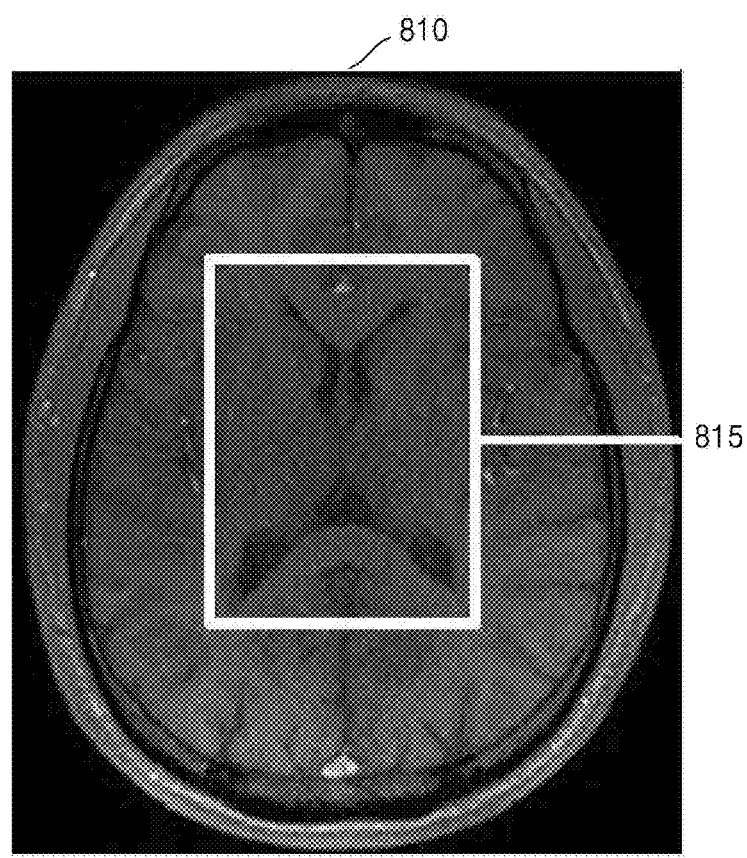
FIGS. 8A, 8B, and 8C are diagrams illustrating magnetic resonance images acquired according to a GRAPPA method.
Figure 8B:
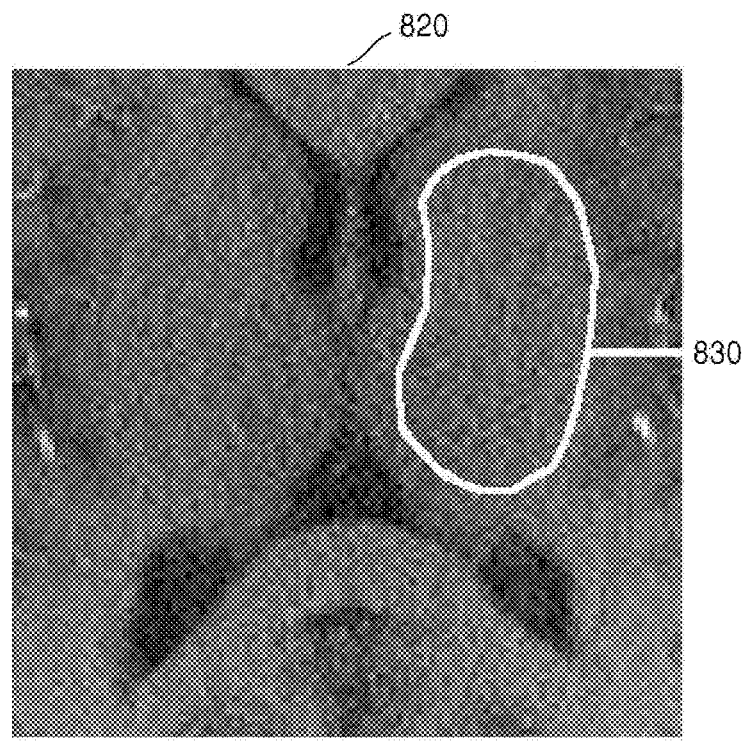
Figure 8C:
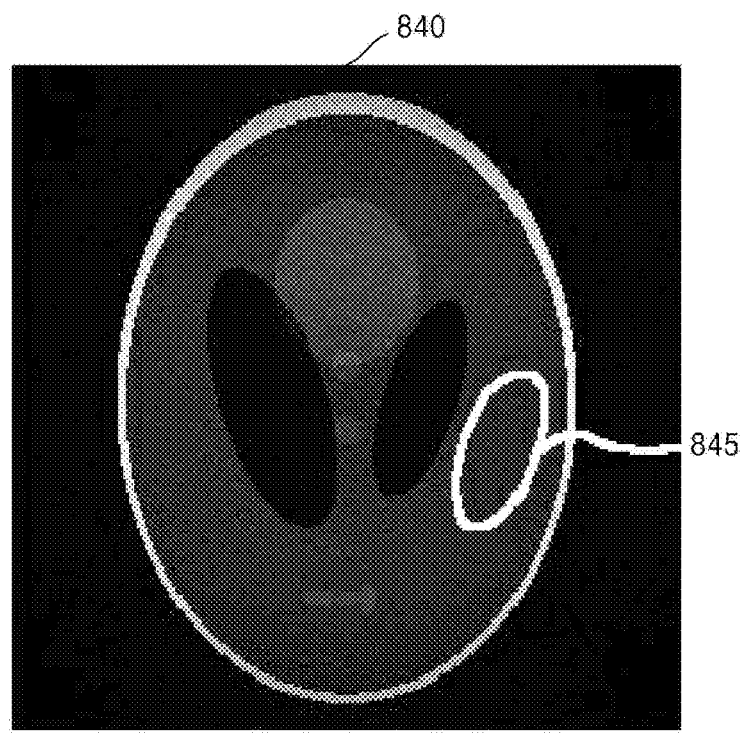

FIGS. 8A through 8C are diagrams illustrating magnetic resonance images acquired according to a GRAPPA method. FIGS. 8A and 8B illustrate images acquired by imaging a brain of a human, and FIG. 8C illustrates an image acquired by imaging a predetermined object.

A magnetic resonance image 810 of FIG. 8A is a magnetic resonance image generated by using multi-coil data according to a related art GRAPPA method. A magnetic resonance image 820 of FIG. 8B is an image acquired by magnifying a portion 815 of the magnetic resonance image 810.

Referring to FIG. 8B, noise and aliasing artifacts 830 exist in the magnetic resonance image 820 generated according to the related art GRAPPA method.

Referring to FIG. 8C, noise and aliasing artifacts 845 exist in a magnetic resonance image 840 generated according to the GRAPPA method.

Figure 9A:
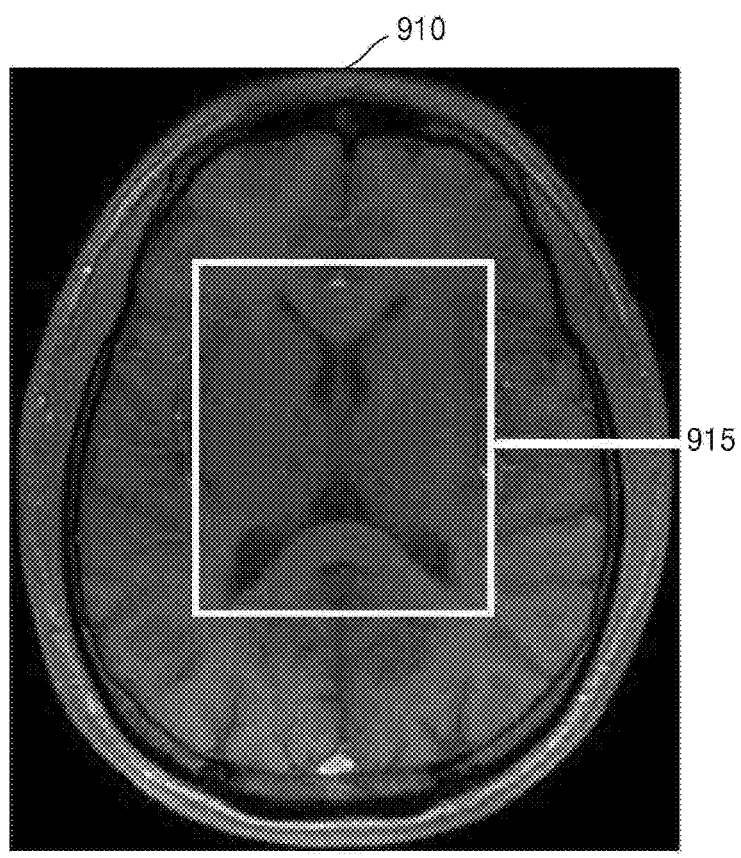
FIGS. 9A, 9B, and 9C are diagrams illustrating magnetic resonance images acquired according to an exemplary embodiment.
Figure 9B:
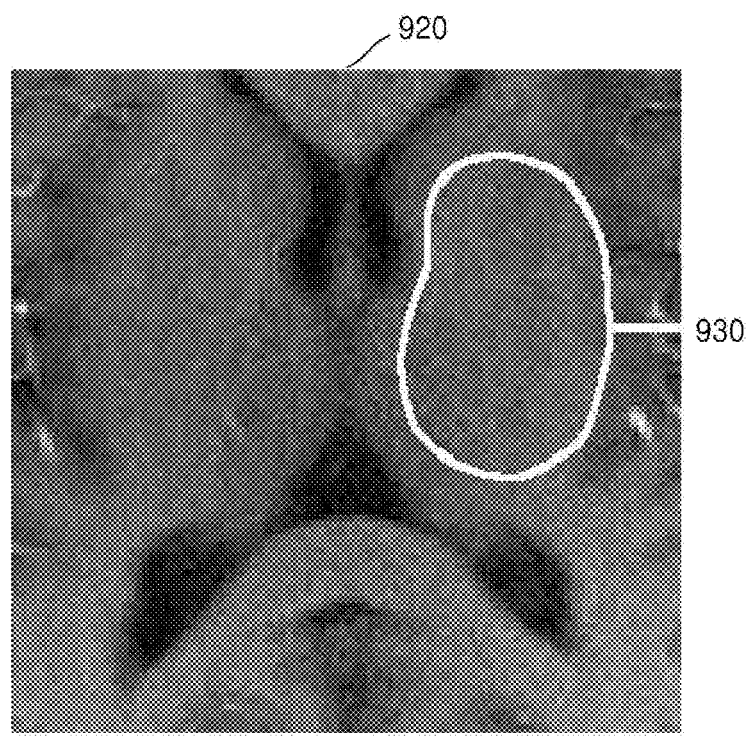
Figure 9C:
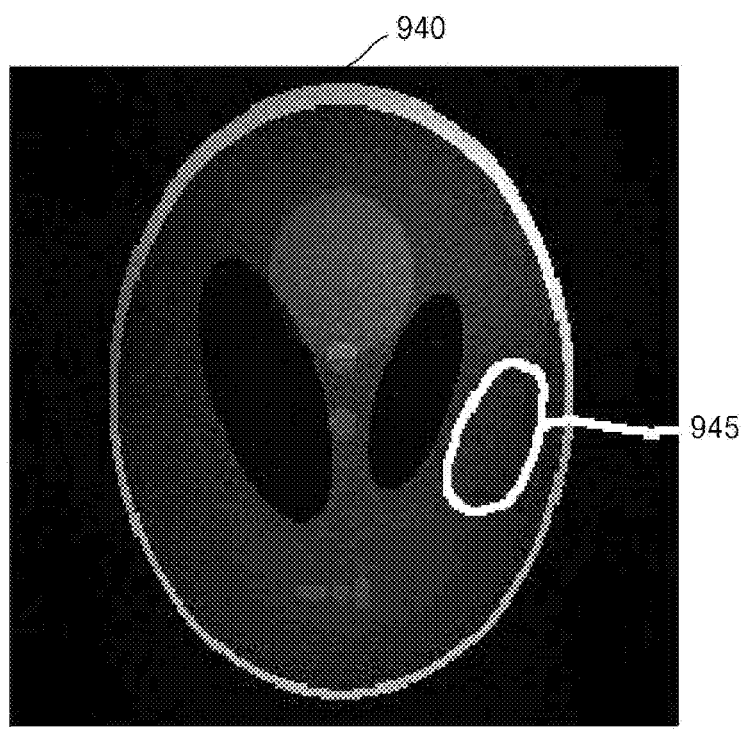

FIGS. 9A through 9C are diagrams illustrating magnetic resonance images acquired by a method and apparatus for generating a magnetic resonance image, according to an exemplary embodiment.

FIGS. 9A and 9B illustrate images acquired by imaging a brain of a human, and FIG. 9C illustrates an image acquired by imaging a predetermined object.

Referring to FIG. 9A, a magnetic resonance image 910 acquired by a method and apparatus for generating a magnetic resonance image, according to an exemplary embodiment is illustrated. A magnetic resonance image 920 of FIG. 9B is an image acquired by magnifying a portion 915 of the magnetic resonance image 910.

Referring to FIG. 9B, when comparing a portion 930 of the magnetic resonance image 920 with the portion 830 of FIG. 8B, in which noise and aliasing artifacts exist, noise and aliasing artifacts are almost non-existent in the magnetic resonance image 920. In addition, referring to FIG. 9C, when comparing a portion 945 of a magnetic resonance image 940 with the portion 845 of FIG. 8C, in which noise and aliasing artifacts exist, noise and aliasing artifacts are almost non-existent in the magnetic resonance image 940.

Figure 10:
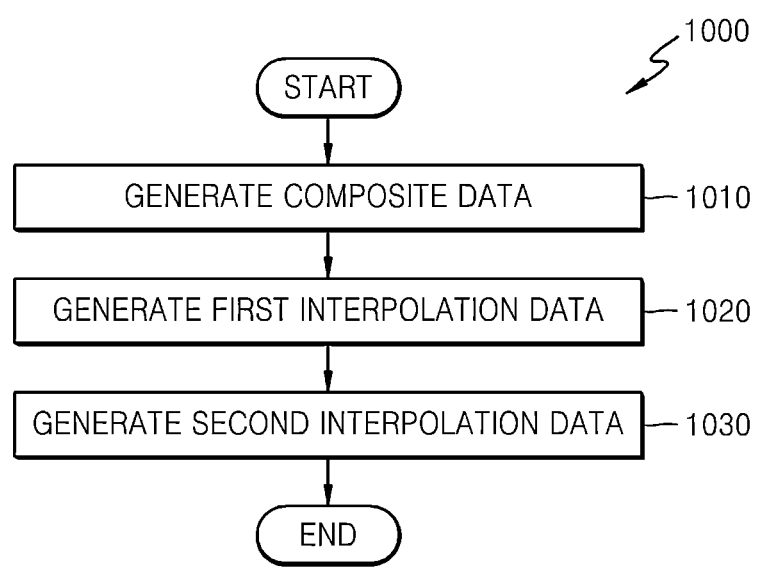
FIG. 10 is a flowchart illustrating a method of generating a magnetic resonance image, according to an exemplary embodiment.

FIG. 10 is a flowchart illustrating a method 1000 of generating a magnetic resonance image, according to an exemplary embodiment. The method 1000 is a method for acquiring a magnetic resonance image by using an RF multi-coil including a plurality of coils.

In operation 1010, the composite data is generated, by combining a plurality of data acquired in each of a plurality of coils, based on coil characteristics of the plurality of coils. Operation 1010 may correspond to operation 410 of FIG. 4 or operation 716 of FIG. 7, and thus, a detailed description thereof is not repeated.

In operation 1020, the first interpolation data is generated by interpolating the composite data generated in operation 1010. Operation 1020 may be performed by the first interpolator 531. Operation 1020 may correspond to operation 420 of FIG. 4 or operation 720 of FIG. 7, and thus, a detailed description thereof is not repeated.

In operation 1030, at least one second interpolation data set is generated by interpolating at least one predetermined data set corresponding to the first interpolation data generated in operation 1020. Operation 1030 may be performed by the second interpolator 551. Operation 1030 may correspond to operation 733 of FIG. 7, and thus, a detailed description thereof is not repeated.

As described above, methods and apparatuses for generating a magnetic resonance image, according to an exemplary embodiment, generate a composite coil and composite data based on information about coil characteristics. Thus, phase cancellation and holes, which may occur when combining K-space data sets corresponding to the individual coils of a multi-coil, may be prevented.

In addition, methods and apparatuses for generating a magnetic resonance image, according to an exemplary embodiment, filter and interpolate composite data corresponding to the K-space data with respect to each of a plurality of frequency bands. Also, noise and aliasing artifacts occurring in a process of restoring a magnetic resonance image may be reduced by generating a magnetic resonance image by using data processed in each of the plurality of frequency bands. Thus, a magnetic resonance image may be more correctly reconstructed.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A method of generating a magnetic resonance image by using a multi-coil including a plurality of coils, the method comprising:
generating a virtual composite coil as a combined corresponding to the plurality of coils, based on coil characteristics of the plurality of coils, respectively, wherein the virtual composite coil has an increased signal to noise ratio (SNR) as compared to SNRs of the plurality of coils;
generating composite data corresponding to the virtual composite coil from data sets acquired from the plurality of coils, respectively, the generated composite data having reduced noise, as compared to that of the data sets, due to the increased SNR of the virtual composite coil;
generating first interpolation data by interpolating the composite data;
filtering the first interpolation data in a plurality of frequency bands, to generate filtered data sets corresponding to the plurality of frequency bands, respectively; and
generating the magnetic resonance image from the filtered data sets.

2. The method of claim 1, wherein the generating the virtual composite coil comprises:
acquiring at least one among coil sensitivities and noise information of the plurality of coils; and
generating the virtual composite coil corresponding to the plurality of coils, based on the at least one among the coil sensitivities and the noise information.

3. The method of claim 1, wherein the plurality of frequency bands comprise a low frequency band and high frequency bands, and the filtering comprises:
generating a first filtered data set corresponding to the low frequency band by low-pass filtering the first interpolation data; and
generating second filtered data sets corresponding to the high frequency bands by high-pass filtering the first interpolation data by applying a plurality of filtering characteristics.

4. The method of claim 1, wherein the generating the magnetic resonance image comprises generating at least one second interpolation data set by interpolating one of the filtered data sets corresponding to at least one of the plurality of frequency bands.

5. The method of claim 4, wherein the generating the magnetic resonance image further comprises generating the magnetic resonance image by performing a weighted combination on at least one of the plurality of filtered data sets and the at least one second interpolation data set.

6. The method of claim 1, wherein the generating the composite data comprises generating the virtual composite coil by adjusting the SNRs of the plurality of coils based on the coil characteristics.

7. The method of claim 1, wherein the coil characteristics comprise at least one among coil sensitivities and noise information comprising at least one among noise map and noise dispersion information, of each of the plurality of coils.

8. The method of claim 1, wherein the generating the first interpolation data comprises interpolating the composite data by using a convolution interpolation method.

9. An apparatus for generating a magnetic resonance image by using a multi-coil including a plurality of coils, the apparatus comprising:
a processor that generates a virtual composite coil as a combined coil corresponding to the plurality of coils, based on coil characteristics of the plurality of coils, respectively, and generates composite data corresponding to the virtual composite coil from data sets acquired from the plurality of coils, respectively, wherein the virtual composite coil has an increased signal to noise ratio (SNR) as compared to SNRs of the plurality of coils;
a filter that generates first interpolation data by interpolating the composite data which has reduced noise, as compared to that of the data sets, due to the increased SNR of the virtual composite coil, and filters the first interpolation data in a plurality of frequency bands, to generate filtered data sets corresponding to the plurality of frequency bands, respectively; and
an image processor that generates the magnetic resonance image from the filtered data sets.

10. The apparatus of claim 9, wherein the processor acquires at least one among coil sensitivities and noise information of the plurality of coils.

11. The apparatus of claim 9, wherein the processor generates the virtual composite coil by adjusting the SNRs of the plurality of coils based on the coil characteristics.

12. The apparatus of claim 9, wherein the filter comprises:
a first interpolator that generates the first interpolation data by interpolating the composite data; and
a filter unit that generates the filtered data sets by filtering the first interpolation data in the plurality of frequency bands.

13. The apparatus of claim 9, wherein the image processor generates at least one second interpolation data set by interpolating one of the filtered data sets corresponding to at least one of the plurality of frequency bands.

14. The apparatus of claim 9, wherein the filter comprises:
a low-pass filter that generates a first filtered data set corresponding to a low frequency band by low-pass filtering the first interpolation data; and
a high-pass filter unit that comprises a plurality of high-pass filters which generate second filtered data sets corresponding to high frequency bands by high-pass filtering the first interpolation data by applying a plurality of filtering characteristics.

15. The apparatus of claim 14, wherein the image processor
generates second interpolation data sets by interpolating the second filtered data sets that are output from the high-pass filter unit, and
generates the magnetic resonance image by performing a weighted combination on the first filtered data set, which is output from the low-pass filter, and the second interpolation data sets.

16. A method of generating a magnetic resonance (MR) image by using a multi-coil including a plurality of coils, the method comprising:

generating a virtual composite coil as a combined coil corresponding to the plurality of coils, based on coil characteristics of the plurality of coils, respectively, wherein the virtual composite coil has an increased signal to noise ratio (SNR) as compared to SNRs of the RF coils;

generating composite data corresponding to the virtual composite coil by combining data sets each acquired for each of the plurality of coils, respectively, the generated composite data having reduced noise, as compared to that of the data sets, due to the increased SNR of the virtual composite coil;

generating first interpolation data by interpolating the composite data;

generating a second interpolation data set by interpolating at least one predetermined data set corresponding to the first interpolation data; and reconstructing the MR image based on the first interpolation data and the second interpolation data.

17. A magnetic resonance imaging (MRI) method comprising:

obtaining data sets from corresponding individual radio frequency (RF) coils of an MR scanner;

generating a virtual composite coil as a combined coil corresponding to the RF coils, based on coil characteristics, respectively, of each of the RF coils, wherein the virtual composite coil has an increased signal to noise ratio (SNR) as compared to SNRs of the RF coils;

generating composite data for the virtual composite coil, from the data sets, the generated composite data having reduced noise, as compared to that of the data sets, due to the increased SNR of the virtual composite coil;

generating a first interpolation data set by interpolating the composite data;

filtering the first interpolation data in a plurality of frequency bands, to generate filtered data sets in the plurality of frequency bands, respectively;

generating a second interpolation data set by interpolating one of the filtered data sets; and generating the magnetic resonance image by combining at least one of the filtered data sets and the second interpolation data set.

18. The method of claim 17, wherein the coil characteristics comprise at least one among coil sensitivities and noise information of the plurality of coils.

19. The method of claim 17, wherein the plurality of frequency bands comprises a low frequency band and high frequency bands, and the filtering comprises:

generating a first filtered data set corresponding to the low frequency band by low-pass filtering the first interpolation data; and generating second filtered data sets corresponding to the high frequency bands by filtering the first interpolation data with different high-pass filters.

20. The method of claim 19, wherein the generating the second interpolation dataset comprises generating the second interpolation data sets by interpolating corresponding second filtered data sets; and the generating the magnetic resonance image comprises applying different weights to the first filtered data and the second interpolation data sets, and combining the weighted datasets.

* * * * *